US009076713B2

(12) United States Patent
Signamarcheix et al.

(10) Patent No.: US 9,076,713 B2
(45) Date of Patent: Jul. 7, 2015

(54) LOCALLY PASSIVATED GERMANIUM-ON-INSULATOR SUBSTRATE

(71) Applicants: Soitec, Bernin (FR); Commissariat à l'Énergie Atomique, Paris (FR)

(72) Inventors: Thomas Signamarcheix, La Terrasse (FR); Frederic Allibert, Grenoble (FR); Chrystel Deguet, Saint Ismier (FR)

(73) Assignees: Soitec, Bernin (FR); Commissariat à l'Énergie Atomique, Paris (FR)

( * ) Notice: Subject to any disclaimer, the term of this patent is extended or adjusted under 35 U.S.C. 154(b) by 81 days.

(21) Appl. No.: 13/748,146

(22) Filed: Jan. 23, 2013

(65) Prior Publication Data

US 2013/0134547 A1    May 30, 2013

Related U.S. Application Data

(62) Division of application No. 12/552,891, filed on Sep. 2, 2009, now Pat. No. 8,372,733.

(30) Foreign Application Priority Data

Sep. 3, 2008   (EP) ..................... 08290827

(51) Int. Cl.
*H01L 27/01* (2006.01)
*H01L 27/12* (2006.01)
(Continued)

(52) U.S. Cl.
CPC .............. *H01L 29/16* (2013.01); *H01L 21/318* (2013.01); *H01L 21/76254* (2013.01); *H01L 21/76283* (2013.01)

(58) Field of Classification Search
CPC .............. H01L 21/76254; H01L 21/84; H01L 27/1203; H01L 29/78684; H01L 21/2007; H01L 31/1812; H01L 2221/68363; H01L 27/1207; H01L 29/1054; H01L 29/78603; H01L 29/66772; H01L 29/7849; H01L 27/092; H01L 27/0922
USPC ................... 257/347, 351, 568, 632, E21.568
See application file for complete search history.

(56) References Cited

U.S. PATENT DOCUMENTS

| 6,372,600 B1 | 4/2002 | Desko et al. ................. 438/406 |
| 7,084,050 B2 | 8/2006 | Bedell et al. ................. 438/480 |

(Continued)

FOREIGN PATENT DOCUMENTS

| EP | 1 081 748 A2 | 3/2001 |
| EP | 1 659 623 B1 | 5/2006 |

(Continued)

OTHER PUBLICATIONS

European Search Report, Appl. No. EP 08290827, Dec. 16, 2008.
(Continued)

*Primary Examiner* — Shouxiang Hu
(74) *Attorney, Agent, or Firm* — Winston & Strawn LLP

(57) ABSTRACT

The invention relates to a method for fabricating a locally passivated germanium-on-insulator substrate wherein, in order to achieve good electron mobility, nitridized regions are provided at localized positions. Nitridizing is achieved using a plasma treatment. The resulting substrates also form part of the invention.

15 Claims, 5 Drawing Sheets

(51) Int. Cl.
*H01L 31/0392* (2006.01)
*H01L 23/58* (2006.01)
*H01L 29/16* (2006.01)
*H01L 21/318* (2006.01)
*H01L 21/762* (2006.01)

(56) References Cited

U.S. PATENT DOCUMENTS

| | | |
|---|---|---|
| 7,348,253 B2 | 3/2008 | Bedell et al. ............... 438/407 |
| 7,781,300 B2 | 8/2010 | Moriceau et al. ........... 438/405 |
| 2005/0070077 A1 | 3/2005 | Guarini et al. ............. 438/479 |
| 2006/0110844 A1 | 5/2006 | Lee et al. .................. 438/57 |
| 2006/0110899 A1 | 5/2006 | Bourdelle et al. .......... 438/584 |
| 2006/0214232 A1 | 9/2006 | Chen et al. ................ 257/351 |
| 2006/0237790 A1 | 10/2006 | Zhu et al. .................. 257/347 |
| 2007/0202660 A1 | 8/2007 | Moriceau et al. .......... 438/424 |

FOREIGN PATENT DOCUMENTS

| | | |
|---|---|---|
| FR | 2 876 220 A1 | 4/2006 |
| JP | 2006-148066 A | 6/2006 |
| JP | 2008-516443 A | 5/2008 |
| WO | WO 2007/148072 A2 | 12/2007 |

OTHER PUBLICATIONS

Signamarcheix et al., "Germanium oxynitride ($GeO_xN_y$) as a back interface passivation layer for Germanium-on-insulator substrates," Applied Physics Letters, 93(2):022109-1-022109-3 (2008).

Sugawara et al., "Physical and electrical properties of plasma nitrided germanium oxynitride," J. Vac. Sci. Technol. B, 24(5):2449-2456 (Sep./Oct. 2006).

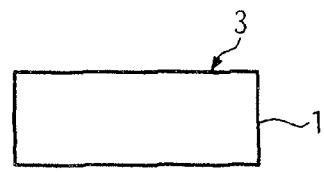
FIG. 1a    FIG. 1b
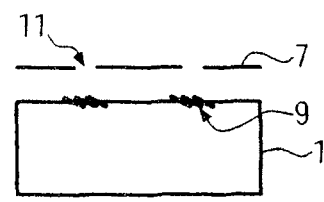
FIG. 1c
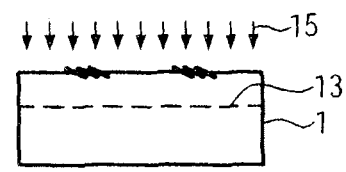
FIG. 1d
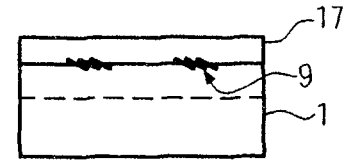
FIG. 1e
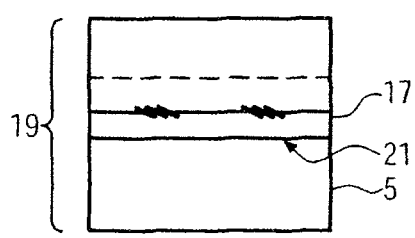
FIG. 1f
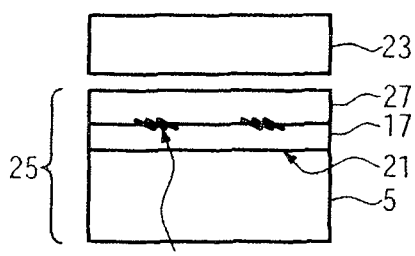
FIG. 1g

LOCALLY PASSIVATED GERMANIUM-ON-INSULATOR SUBSTRATE

BACKGROUND

The invention relates to a method for fabricating a germanium-on-insulator (GeOI) substrate and a germanium-on-insulator substrate.

Germanium-on-insulator structures are generally known in the art. EP 1 659 623 A1 discloses a method to fabricate a germanium-on-insulator (GeOI) substrate during which a germanium oxynitride ($GeO_xN_y$) layer is provided as a buried dielectric between a Ge layer and a handle substrate, e.g., a Si wafer. T. Signamarcheix et al in Applied Physics Letters 93, 022109 (2008) describes the advantageous effect of the presence of a $GeO_xN_y$ layer underlying the active Ge layer concerning the electron mobility. Thus, this kind of substrate can advantageously be used for electronic devices based on n-MOS technology. It appears, however, that the hole mobility became affected by the presence of the $GeO_xN_y$ layer so that concerning p-MOS devices, this kind of substrate is less suited.

Accordingly, there is a need for improved germanium-on-insulator substrates and these are now provided by the present invention.

SUMMARY OF THE INVENTION

The invention relates to a method for fabricating a locally passivated germanium-on-insulator substrate which comprises the steps of: providing a germanium (Ge) substrate or a substrate comprising a Ge containing layer, in particular an epitaxial Ge layer or a silicon germanium layer (SiGe), as a source substrate, and locally treating the source substrate to provide passivated regions, in particular regions of $GeO_xN_y$. With the inventive method, a germanium-on-insulator substrate with satisfying electronic properties, in particular high electron mobility in the passivated zones and hole mobility in the non passivated regions, can be obtained. In case of a SiGe layer, the inventive method is particularly advantageous for high Ge contents of more than 50%, in particular more than 70%.

Preferably, the passivation of the source substrate, the surface of which comprises a native Ge oxide which needs to be stabilized, is achieved by providing a germanium oxynitride ($GeO_xN_y$) layer with a substantial nitrogen content of 20 to 50%. With this $GeO_xN_y$ layer, the desired passivation and the desired improvements concerning electron mobility in the Ge layer directly above the passivated region in the final substrate, can be achieved.

Advantageously, the source substrate can be locally treated by providing a patterned mask over the source substrate. With this method, any pattern can be realised on the source substrate so that the regions which should show a high electron mobility according to the desired final structures, can be achieved. As an alternative, maskless patterning methods can also be used.

Preferably, the passivating can be achieved by nitridizing. Using this method, advantage is taken of the already present natural Ge oxide to obtain the $GeO_xN_y$ layer.

Preferably, the source substrate can be locally treated using a plasma, in particular a $NH_3$, $N_2$ or $N_2O$ plasma. According to a variant, the $NH_3$, $N_2$ or $N_2O$ plasma can be diluted in 10% to 30% Ar. With this method and in particular at low pressure, in particular with a plasma of less than 40 mTorr, preferably in a range of 1 to 10 mTorr, a significant amount of up to 40% Nitrogen atoms can be incorporated into the substrate. Optimized results have been achieved for a pressure of 5 mTorr. This process is preferably carried out at a temperature of 25° C. up to 600° C.

Advantageously, the local treatment of source substrate can further comprise applying an oxygen and/or argon plasma, in particular before applying the $NH_3$, $N_2$ or $N_2O$ plasma. The oxygen comprising plasma can advantageously be used to improve and/or thicken the germanium oxide layer on top of the source substrate. Providing the nitrogen containing plasma after the oxygen plasma has the advantageous effect of passivating (both chemically and electronically) the surface of the source substrate.

According to a preferred embodiment, the method can further comprise a step of providing a predetermined splitting area inside the source substrate before or after the local treatment step. Preferably, this step includes implanting an atomic species into the source substrate to form a zone of weakness at which splitting is intended to occur.

The inventive method can further comprise a further step of providing a dielectric layer, in particular an oxide, on the source substrate before or after the implanting step. In case the predetermined splitting area is provided after providing the dielectric layer, the dielectric layer could be at least partially removed to improve surface quality. In all other cases, the dielectric layer is used to provide the desired dielectric properties of the buried layer of the GeOI substrate over the passivated and non passivated regions of the source substrate. The local passivation treatment may create a slight surface topology. Providing the dielectric layer on the locally passivated surface has the advantage that a planarization step (e.g., by CMP) can be carried out. This will also form a surface which can easily be bonded to other substrates.

In a further preferred variant, the locally passivated source substrate can be annealed to stabilize the $GeO_xN_y$ passivation surface, in particular for 1 hour or more at about 600° C. This can be performed before or after the mask removal. The thermal treatment has the consequence of stabilising the $GeO_xN_y$ regions and, depending on the mask type used, also to sublime the mask layer.

A further method comprises attaching, preferably by bonding, of the source substrate to a handle substrate, and then detaching the source substrate at the predetermined splitting area, to thereby obtain the locally passivated GeOI substrate. With the stable $GeO_xN_y$ dielectric layer on the source substrate it becomes possible to transfer a thin Ge layer together with the $GeO_xN_y$ layer in the nitridized regions to achieve the desired locally passivated GeOI substrate. The handle substrate is preferably a silicon wafer.

Advantageously, the method can further comprise a step of providing a dielectric layer, in particular an oxide, on the handle substrate before the substrates are bonded together, in particular when there is no dielectric provided on the source substrate. In the case of a silicon wafer, the dielectric can be a thermal oxide and/or a deposited oxide. Thus, bonding can be achieved between the locally passivated surface of the source substrate and the dielectric of the handle substrate, between the dielectric of the source substrate and the surface of the handle substrate without dielectric, or between the dielectric layers of the source and handle substrate.

According to an advantageous variant, the method can furthermore comprise a step of activating the handle substrate using a plasma, in particular an oxygen plasma and/or $NH_3$, $N_2$ or $N_2O$ plasma, in particular mixed with Ar, before the bonding step. Activating of the handle substrate surface provides improved bonding between the substrates.

Preferably, bonding can be carried out directly after the plasma treatment step is conducted on the source substrate or the handle substrate without any intervening further process step. By immediately carrying out the bonding step, a deterioration of the $GeO_xN_y$ surface can be prevented and superior final products be achieved. Thus, according to the invention, passivation of the Ge material and activating of the surface for bonding are achieved in a single step. Of course, prior to bonding, the patterned mask needs to be removed.

Advantageously, the mask used in the mask providing step can be at least one of a shadow mask, in particular a Teflon mask or metal mask or a deposited mask, in particular a photo resist based mask, with a thickness of 1 µm or less or a germanium oxide or $GeO_2$ mask. It was found that these types of masks are suitable to provide the desired locally passivated regions in the source substrate. Prior to bonding, the mask is removed using, for example, dry or wet etching, in particular a plasma etching using $N_2$, or by a thermal treatment as long as the passivation is not negatively affected.

Preferably the local treatment step can comprise the steps of: providing a germanium oxide or $GeO_x$ layer, which can be the natural or a deposited one, on the source substrate, providing a photo resist layer, nano-imprinting the photo resist layer, and providing the pattern by plasma etching in particular reactive ion etching (RIE). According to an alternative embodiment, the $GeO_x$ layer can also be patterned using a laser or electron beam treatment. Using the nano-imprinting step, locally passivated structures like islands of a micro- and/or nanometric size are readily achievable.

Advantageously, the photoresist layer can be removed before the local passivation such that the step of removing the photoresist layer does not have an impact on the locally passivated regions.

According to a preferred embodiment, the method can furthermore comprise a step of providing alignment marks on or in the source substrate. According to the invention, the substrate will present areas of the Ge "top" layer that should receive n-MOS type of devices due to improved electron mobility over the locally passivated regions and other areas away from the locally passivated regions are suited to receive p-MOS type of devices as; in those regions; the hole mobility is better. The alignment marks will support the steps of manufacturing the n-MOS and/or p-MOS devices as they provide a reference point so that the various devices can be formed on their corresponding regions.

Advantageously, the method can further comprise a step of providing recesses in the source substrate pattern. The pattern of the recesses is chosen such that it becomes possible to know where the buried locally passivated regions are positioned. It is not necessary to use the same pattern as the one of the passivated regions as long as positioning of preferably all buried locally passivated regions is possible.

According to a further preferred embodiment, a dielectric, in particular a $SiO_2$ layer, can be provided in the recesses. After depositing the $SiO_2$ layer, a planarization step, e.g., a CMP step, can be carried out to obtain a surface with $SiO_2$ islands inside a Ge surface. Based on the properties of the dielectric, it becomes possible to identify the passivated regions. Preferably, this dielectric layer is the same as the one described previously.

Preferably the dielectric layer can be provided such that the predetermined splitting area is crossing the recesses of the source substrate. This has the advantage that the dielectric is visible on the surface thus the locally passivated regions buried in the substrate can be identified from outside the substrate. Preferably, the recesses can have a depth of 0.5 to 2 µm.

The means for alignment can be provided before or after providing the locally passivated regions. Providing them before the passivated regions has the advantage that the fabrication process concerning the means for alignment does not have an impact on the locally passivated regions.

The invention also relates to a germanium-on-insulator substrate comprising locally passivated regions, in particular, substrates obtainable according to one or a combination of any of the methods described herein. With such a germanium-on-insulator substrate, the above described advantages can be achieved.

Thus, the invention relates to a germanium-on-insulator substrate (GeOI) comprising buried passivated regions. According to a preferred embodiment, the germanium-on-insulator substrate can furthermore comprise alignment marks, in particular $SiO_2$ islands, configured and arranged to identify the positions of the buried passivated regions. Preferably the alignment marks, extend up to the surface of the GeOI substrate.

Another embodiment of the invention is an electronic device comprising nmos and pmos device structures on or in one of the germanium-on-insulator substrates described herein, wherein the nmos structures are provided over the localised, passivated regions, and the pmos structures are provided over other regions of the germanium-on-insulator substrate. Other electronic devices incorporating the novel substrates of the invention can be envsioned by those persons of ordinary skill in the art. The substrates that include alignment marks are especially useful in forming these electronic devices.

BRIEF DESCRIPTION OF THE DRAWINGS

Advantageous and preferred embodiments of the invention will be described in the following text by referring to the drawing figures, wherein:

FIGS. 1A-1G show a first embodiment of the method for fabricating a germanium-on-insulator type wafer according to the invention.

DETAILED DESCRIPTION OF THE PREFERRED EMBODIMENTS

Figure 2A:
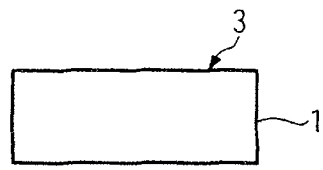
FIGS. 2A-2G show a second embodiment of the method for fabricating a germanium-on-insulator type wafer according to the invention.
Figure 2B:

In the following specification, the overall method for fabricating a germanium-on-insulator type wafer according to the invention will be described based on the well known SmartCut™ technology. However, other suitable semiconductor on insulator providing manufacturing methods can also be adapted to the invention, for example, a bonding and grind/etch back process.

FIG. 1A illustrates a germanium (Ge) substrate 1 or, as a variant, a substrate with a germanium containing layer, in particular an epitaxial Ge layer or a silicon and germanium comprising layer SiGe, provided on one of its main surfaces. In the case of a SiGe layer, the Ge content is preferably at least 50%, more preferred more than 70%. Prior to further treatment steps, the surface 3 of the source substrate 1 may be cleaned using, for instance, a HF base solution (fluoric acid).

FIG. 1B illustrates a handle substrate 5 which can be, for example, a germanium wafer, a silicon wafer, a silicon carbide wafer, a wafer presenting a silicon germanium front surface or a gallium arsenide wafer. Eventually, also a quartz type wafer could be used. Both the source substrate 1, as well as the handle substrate 5, may have any suitable size of form such as, for example 200 mm or 300 mm type wafers.

FIG. 1C illustrates steps b) and c) of the inventive method for fabricating a locally passivated germanium-on-insulator wafer according to claim 1 which consists of first providing a patterned mask 7 over the source substrate 1 and then treating the source substrate 1 via the patterned mask 7 to obtain locally $GeO_xN_y$ regions 9 in or on the source substrate 1.

The mask can be a contact mask, thus provided on the source substrate 1. According to a variant, as illustrated in FIG. 1C, a non-contact mask positioned above the surface 3 of the source substrate 1 can be provided. In this case, the mask 7 can be a Teflon mask or a metal on the source substrate 1.

The openings 11 in the mask 7 are of micrometric or nanometric size so that the locally passivated regions 9 of the source substrate 1 are also in the micrometric or nanometric range. They can have a regular size or varying size with respect to each other.

According to this embodiment of the invention, the treatment step is a nitridizing step using a nitrogen comprising plasma, in particular a $NH_3$, $N_2$ or $N_2O$ plasma diluted in an Argon plasma, to incorporate nitrogen atoms into substrate 1.

Preferably, the plasma is applied for about 60 seconds at low pressures of less than 40 mTorr, in particular in a range of 1-10 mTorr. The preferred temperature range is 25° C. up to 600° C. Optimized results have been achieved in a pressure range of 5 mTorr and at temperatures of 150° C. It appears that the lower the pressure of the plasma, the more nitrogen can be incorporated. The plasma treatment can be followed by a temperature treatment around 600° C. This is particularly useful in the case where the mask 7 is formed of $GeO_2$. The thermal treatment has then the consequence of stabilising the $GeO_xN_y$ regions 9 and also to sublime (to render volatile) the $GeO_2$ mask layer. This treatment is a surface treatment and the thickness of the N rich regions is less than 10 nm, preferably less than 5 nm, more preferably 3 nm.

Actually, due to the presence of oxygen as natural germanium oxide on the surface of the germanium substrate 1 or in the environment during the passivation treatment, the nitridizing steps leads to the creation of $GeO_xN_y$ type islands in those regions 9. In the final germanium-on-insulator substrate (see further down), the Ge material of the top layer above those islands shows a high electron mobility.

Following the removal of the mask 7, a predetermined splitting area 13 is provided inside the source substrate 1 as illustrated in FIG. 1D. The predetermined splitting area 11 is essentially parallel to the main surface 3, which is provided with the locally passivated germanium oxynitride regions 9. According to the SmartCut™ technology, the predetermined splitting area is obtained by implanting atomic species 15, for instance hydrogen or helium ions, with a predetermined energy and dose into the source substrate 1. According to a variant, this step can also be carried out before the removal of the mask 7.

Afterwards, as illustrated in FIG. 1E, a dielectric layer 17, in particular an oxide layer such as a silicon dioxide layer, is provided, e.g., by deposition, on the source substrate 1. This layer 17 extends over the entire surface of the source substrate 1, thus also over the passivated regions 9. Subsequently, a planarization step could be carried out, e.g., by CMP.

In a subsequent step, the source substrate 1 with the nitridized regions 9 and the dielectric layers 17 is attached, in particular by bonding, to the handle substrate 5 to form a source-handle compound 19. Bonding occurs between the surface of the handle substrate 5 and the surface 21 of the dielectric layer 17 (see FIG. 1F).

FIG. 1G illustrates the result of the detachment step which occurs at the predetermined splitting area 13. Typically, a thermal annealing leads to the desired detachment, however other energy providing means may also be suitable in replacement or in complement of the anneal. Actually, during annealing, a weakening of the predetermined splitting area 13 until complete detachment between the remainder 23 and the newly formed germanium-on-insulator substrate 25 with locally passivated regions 9 occurs. The inventive germanium-on-insulator substrate 25 with locally passivated regions 9, comprises the handle substrate 5, the dielectric layer 17, the passivated regions 9 and a transferred germanium layer 27. Like already mentioned, the substrate 25 shows improved electron mobility in the passivated regions and in the non passivated regions the hole mobility is not negatively affected by the passivation.

The remainder 23 of the source substrate 1 can then be reused as a source substrate 1 in subsequent locally passivated germanium-on-insulator manufacturing processes.

According to variants of the first embodiment, the sequence of the various steps can be changed. Thus, according to one variant, the ion implanting step illustrated in FIG. 1D is carried out before creating the nitridized regions 9, thus before the step illustrated in FIG. 1C. Furthermore, according to a second variant, the dielectric layer 17 is provided on the nitridized regions 9 before ion implantation. Thus, the step illustrated in FIG. 1E can be carried out before the step illustrated in FIG. 1D. Eventually, in this variant, a surface region of the dielectric layer 17 is removed after ion implantation to improve the surface quality. According to a third variant of the first embodiment, prior to applying the nitrogen containing plasma, an oxygen and/or argon containing plasma can be applied to improve and/or thicken the germanium oxide layer which is already present on top of the source substrate 1. The role of the nitrogen containing plasma is then to activate the surface of the source substrate 1 in the nitridized regions 9.

The final product 25 can furthermore receive additional treatments, such as a polish and/or a heat treatment, to stabilize the structure.

FIGS. 2A-2G illustrate a second embodiment of the inventive method.

The steps illustrated in FIGS. 2A-2D correspond to the steps illustrated in FIGS. 1A-1D. Their description is therefore not repeated again, but incorporated herewith by reference to the description of FIGS. 1A-1D. The difference between the first and second embodiments is that, instead of providing a dielectric layer 17 onto the source substrate 1 following the nitridizing step, a dielectric layer 31, e.g., silicon dioxide, is provided, for example by deposition or a thermal treatment, on the handle substrate 5, like illustrated in FIG. 2E.

The surface 33 of the dielectric layer 31 undergoes an activation using a plasma, in particular an oxygen plasma and/or nitrogen containing plasma e.g., $NH_3$, $N_2$ or $N_2O$ plasma. The plasma treatment of layer 31 is carried out under conditions compared to the plasma treatment conditions of the source substrate described in detail with respect to FIG. 1C.

Figure 2C:
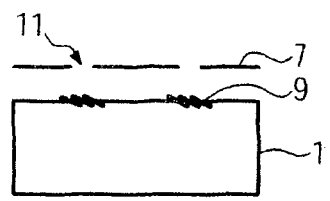
Figure 2E:
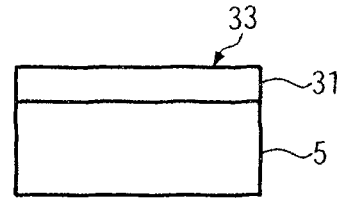
Figure 2D:
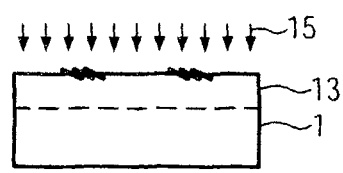
Figure 2F:
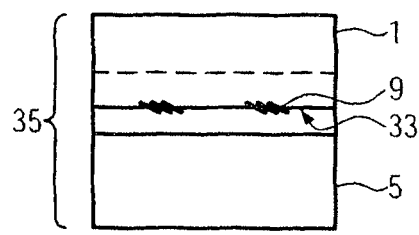

FIG. 2F then illustrates the step of attaching, in particular by molecular bonding, the source substrate 1 to the handle substrate 5 to form the source-handle compound structure 33. In this case, bonding occurs at surface 33 of the dielectric layer 31 and the surface 3 of the source substrate 1 with the passivated regions 9.

Figure 2G:
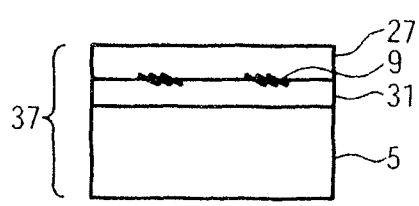

Just like in the first embodiment, the next step, illustrated in FIG. 2G, consists in detaching the germanium-on-insulator type substrate 37 from the remainder of the source substrate 1 (not shown). The germanium-on-insulator substrate 37 in this embodiment comprises the handle substrate 5, the dielectric layer 31, the locally passivated regions 9 and the transferred layer 27.

According to a variant, the steps illustrated in FIGS. 2C and 2D can be exchanged such that the passivated regions 9 are achieved after providing the predetermined splitting area 13. In this case, attachment can be carried out immediately after the plasma treatment on the source substrate 1 and the plasma treatment on the dielectric layer 31 and an improved stability of the stoichiometry of the $GeO_xN_y$ regions 9 is observed.

Of course, the methods according to embodiment 1 and embodiment 2 can be combined in which case the attachment is achieved between dielectric layer 17 and dielectric layer 31.

FIGS. 3A-3G illustrate a third embodiment of providing a locally passivated germanium-on-insulator substrate according to the invention. FIGS. 3A-3G illustrate in detail one possibility to provide a patterned mask and, using this mask, to treat the source substrate 1 to obtain locally passivated regions 9 on the source substrate 1. The mask in this embodiment is in contact with the surface 3 of the source substrate 1.

Figure 3A:
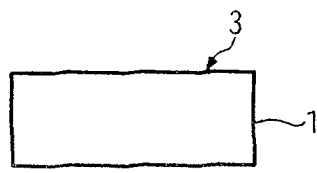
FIGS. 3A-3G show a third embodiment of the method for fabricating a germanium-on-insulator type wafer according to the invention.
Figure 3B:
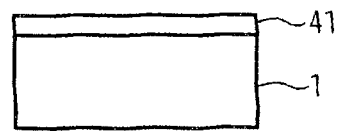
Figure 3C:
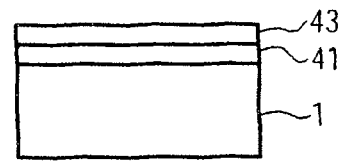
Figure 3D:
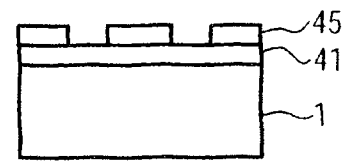
Figure 3E:
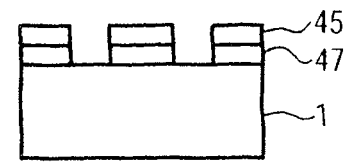

FIG. 3A corresponds to FIGS. 1A and 2A, thus represents the source substrate 1, a germanium wafer or a wafer with a germanium layer on its surface 3. FIG. 3B illustrates the next step of providing a germanium dioxide $GeO_2$ layer 41 on the surface 3 of the source substrate 1. The germanium dioxide layer 41 corresponds to the natural oxide layer or can be a deposited one.

Figure 3F:
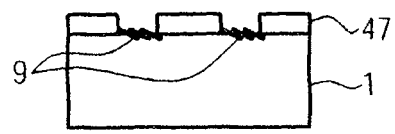
Figure 3G:

The next step consists in providing a photoresist layer 43 on the germanium dioxide layer 41. Subsequently, using a nano-imprint process known in the art, the photoresist layer 43 is patterned. Via the patterned photoresist layer 45, a patterned mask 47 is created inside the germanium dioxide layer 43 to play the role of mask 7, as illustrated in FIG. 1C. Patterning of layer 43 is e.g., achieved by using a reactive ion etching process. As an alternative, instead of providing the photoresist layer, also a laser ablation, ion beam or electron beam sputtering process can be used to create the mask 47 in the germanium dioxide layer 41. Preferably, the photoresist layer 45 is removed before the passivation step such that the step of removing the photoresist layer does not have an impact (removal) on the passivated surface layer. Via the mask 47, a nitridizing treatment, as described with respect to FIG. 1C, is then applied to form the nitridized regions 9 in the source substrate 1. The result of this step is illustrated in FIG. 3F.

Finally, the mask 47 is removed, e.g., using an $N_2$ plasma or a thermal treatment at about 600° C. for one hour or more.

FIGS. 4A-4F illustrate a fourth embodiment for fabricating a locally passivated germanium-on-insulator substrate according to the invention. As already illustrated in FIGS. 1A, 2A and 3A, the step illustrated in FIG. 4A consists in providing a germanium substrate 1 or a substrate comprising an epitaxial germanium layer, such that the surface 3 of substrate 1 is a germanium layer. Process steps already previously described are not repeated again in detail, but their description is incorporated herewith by reference.

Subsequently, using a mask 51, recesses 53 are provided in the source substrate 1. These recesses 53 have a depth $d_1$ and are, for example, obtained using an etching process such as reactive ion etching. The recesses 53 have a micrometric depth of, for example, 1 micron (see FIG. 4B).

Subsequently, the process step as illustrated in FIG. 1C is carried out (FIG. 4C), namely the source substrate 1 with the recesses 53 is treated via mask 7 to obtain locally passivated regions 55 comparable to the ones 9 illustrated in FIG. 1C. Actually, the only difference between the locally passivated regions 55 and the ones 9 illustrated in FIG. 1C is that, now, these locally passivated regions 55 are provided inside the recesses 53.

As a next step (FIG. 4D), a dielectric layer 57, e.g., $SiO_2$, is provided over the source substrate 1 which covers the locally passivated regions 55 and the recesses 53. To smoothen the surface of the dielectric layer 57, a polishing step, such as CMP, is carried out.

Figure 4A:
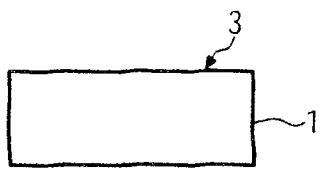
FIGS. 4A-4F show a fourth embodiment of the method for fabricating a germanium-on-insulator type wafer according to the invention.
Figure 4B:
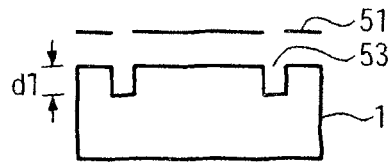
Figure 4C:
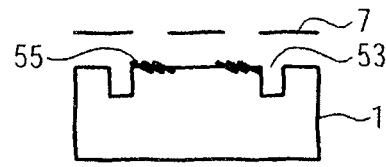
Figure 4D:
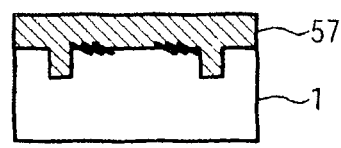
Figure 4E:
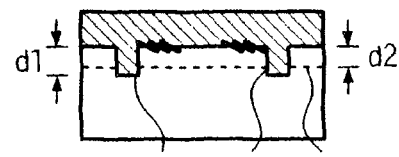

Then, as illustrated in FIGS. 1D and 4E, a predetermined splitting area 13 is created inside the source substrate 1. According to the invention, the predetermined splitting area 13 is created at a depth $d_2$ being smaller than the distance $d_1$ of the surface of the germanium substrate down to the bottom 59 of the recess 53.

Figure 4F:
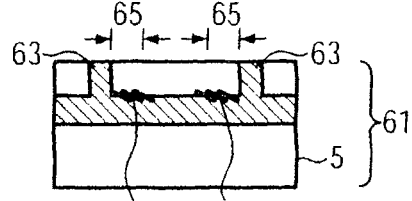

Subsequently, the source substrate 1 with dielectric layer 57 is attached, preferably by bonding, to a handle substrate 5 (like described with respect to FIGS. 1B and 1F) and detachment occurs at the predetermined splitting area 13 as illustrated in FIG. 1G. After detachment, the locally passivated germanium-on-insulator substrate 61, as illustrated in FIG. 4F, is obtained. As the alignment marks 63 are on the surface of substrate 61, it becomes easy to identify the position of the germanium islands 65 overlaying the locally passivated regions 55 based on the fixed positional relationship between alignment marks 63 and passivated regions (based on their respective masks 7 and 51).

Embodiments 1-4 can be freely combined to achieve further variants of the invention.

The locally passivated germanium-on-insulator substrates 25, 37 and 61, as well as the various variants thereof, find their application in devices having n-MOS and p-MOS structures fabricated on a single substrate. In particular, advantage is taken of the high electron mobility in the passivated regions and the good hole mobility in the other regions.

Figure 5:
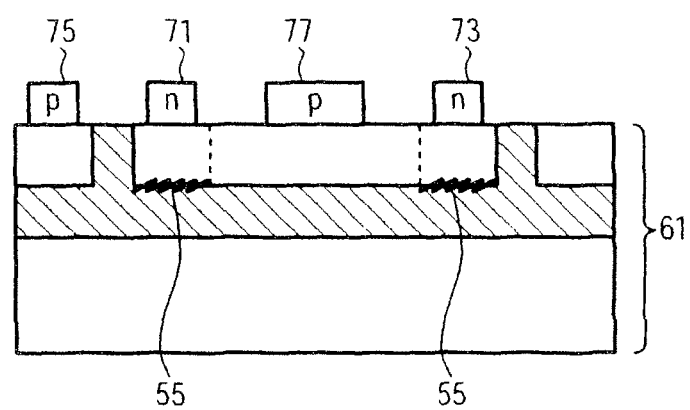
FIG. 5 illustrates a fifth embodiment of the invention, namely an electronic device comprising n-MOS and p-MOS structures provided on a substrate fabricated a germanium-on-insulator type wafer according to the invention.

FIG. 5 illustrates the substrate 61 and further electronic structures. As illustrated in FIG. 5, n-MOS devices 71, 73 are positioned above the passivated regions 55 (because of higher electron mobility in this area) and p-MOS devices 75, 77 are fabricated over the non passivated areas (because of higher hole mobility). This allows to have a wafer on which both type of devices can have improved performance. The alignment marks 63 on the surface are advantageously used to precisely position each respective device 71, 73, 75, 77 over the specific area of the substrate 61. Thus superior devices based on germanium-on-insulator substrates can be fabricated.

What is claimed is:

1. A germanium-on-insulator substrate comprising a germanium (Ge) substrate, a Ge containing surface layer having a Ge content of at least 50%, an insulator layer located between the substrate and the surface layer, and locally passivated separated regions of germanium oxynitride located between the Ge containing surface layer and the insulator layer, wherein the insulator layer is formed of a material different from that of the locally passivated separated regions.

2. The germanium-on-insulator substrate of claim 1, wherein the locally passivated regions have micrometric or nanometric sizes.

3. The germanium-on-insulator substrate of claim 1, wherein the locally passivated regions comprise islands of germanium oxynitride.

4. The germanium-on-insulator substrate of claim 1, wherein the surface layer includes a pattern of dielectric islands.

5. The germanium-on-insulator substrate of claim 1, wherein the insulator layer is a layer of an oxide or silicon dioxide.

6. The germanium-on-insulator substrate of claim 1, wherein the surface layer is a silicon germanium layer having a germanium content of at least 70%.

7. The germanium-on-insulator substrate of claim 1, wherein the surface layer is an epitaxial Ge layer.

8. The germanium-on-insulator substrate of claim 1, which further comprises alignment marks configured and arranged to identify the positions of the locally passivated regions.

9. An electronic device comprising nmos and pmos device structures on or in the germanium-on-insulator substrate of claim 1, wherein the nmos structures are provided over the locally passivated separated regions, and the pmos structures are provided over other regions of the surface layer between the locally passivated separated regions in a top view.

10. An electronic device comprising nmos and pmos device structures on a germanium-on-insulator substrate comprising a substrate of germanium; a germanium (Ge) containing surface layer having a germanium content of at least 50%; an insulator layer of an oxide or silicon dioxide located between the substrate and surface layer; and locally passivated separated regions of germanium oxynitride located in between the Ge containing surface layer and the insulator layer, wherein the locally passivated regions have micrometric or nanometric sizes, and wherein the nmos structures are provided on the Ge containing surface layer over the locally passivated regions, and the pmos structures are provided over other regions of the surface layer between the locally passivated separated regions in a top view, wherein the insulator layer is formed of a material different from that of the locally passivated separated regions.

11. The germanium-on-insulator substrate of claim 10, wherein portions of the insulator layer extend through the Ge containing surface layer to an exposed surface.

12. The germanium-on-insulator substrate of claim 11, wherein the portions of the insulator layer that extend through the exposed surface of the Ge containing surface layer form alignment marks that are configured and arranged to identify positions of the locally passivated regions.

13. The germanium-on-insulator substrate of claim 11, further comprising nmos and pmos device structures on the exposed surface layer, wherein the nmos structures are provided over the localised, passivated regions, and the pmos structures are provided over other regions of the exposed surface layer between the locally passivated separated regions in a top view.

14. The germanium-on-insulator substrate of claim 10, wherein the surface layer is a silicon germanium layer having a germanium content of at least 70%.

15. The germanium-on-insulator substrate of claim 10, wherein the surface layer is an epitaxial Ge layer.

* * * * *